(12) United States Patent
Baftiri (10) Patent No.: US 12,322,622 B2
(45) Date of Patent: Jun. 3, 2025

(54) COMPONENT CARRIER WITH GAP AROUND COMPONENT CORE AND FILLED WITH FIRST MATERIAL IN BOTTOM PORTION AND WITH SECOND MATERIAL IN TOP PORTION

(71) Applicant: AT&S Austria Technologie & Systemtechnik Aktiengesellschaft, Leoben (AT)

(72) Inventor: Artan Baftiri, Chongqing (CN)

(73) Assignee: AT&S Austria Technologie & Systemtechnik Aktiengesellschaft, Leoben (AT)

( * ) Notice: Subject to any disclaimer, the term of this patent is extended or adjusted under 35 U.S.C. 154(b) by 518 days.

(21) Appl. No.: 17/655,480

(22) Filed: Mar. 18, 2022

(65) Prior Publication Data
US 2022/0310428 A1    Sep. 29, 2022

(30) Foreign Application Priority Data

Mar. 24, 2021  (CN) .......................... 202110313927.0
Jun. 16, 2021  (CN) .......................... 202110667460.X (51) Int. Cl.
*H01L 21/673*     (2006.01)
*H01L 21/683*     (2006.01)

(52) U.S. Cl.
CPC .... *H01L 21/67386* (2013.01); *H01L 21/6835* (2013.01); *H01L 2221/68318* (2013.01)

(58) Field of Classification Search
CPC . H01L 21/673; H01L 21/683; H01L 21/6835; H01L 21/67386; H01L 2221/68318

USPC ......................................................... 174/260
See application file for complete search history.

(56) References Cited

U.S. PATENT DOCUMENTS

| | | |
|---|---|---|
| 9,147,587 B2 | 9/2015 | Lin et al. |
| 2005/0253244 A1 | 11/2005 | Chang |
| 2009/0072384 A1 | 3/2009 | Wong et al. |
| 2016/0099213 A1 | 4/2016 | Tae et al. |
| 2017/0330837 A1 | 11/2017 | Stahr |
| 2017/0358535 A1 | 12/2017 | Yoo et al. |
| 2017/0373011 A1 | 12/2017 | Gowda et al. |
| 2019/0326188 A1 | 10/2019 | Tuominen et al. |

FOREIGN PATENT DOCUMENTS

| | | |
|---|---|---|
| EP | 3 273 467 A2 | 1/2018 |
| EP | 3478033 A1 | 5/2019 |

OTHER PUBLICATIONS

Kästner, M.; Extended European Search Report in Application 22162855.5; pp. 1-10; Aug. 17, 2022; European Patent Office, 80298, Munich, Germany.

*Primary Examiner* — Tremesha W Burns
(74) *Attorney, Agent, or Firm* — Robert A. Blaha; Smith Tempel Blaha LLC (57) ABSTRACT

A component carrier includes a core with a dielectric body, a component embedded at least partially in the core, a first dielectric layer being arranged at a bottom side of the core and of the component, and a second dielectric layer being arranged at a top side of the core and of the component. A gap around the component in the core is filled adjacent to the bottom side with material of the first dielectric layer and is filled adjacent to the top side with material of the second dielectric layer.

15 Claims, 7 Drawing Sheets

COMPONENT CARRIER WITH GAP AROUND COMPONENT CORE AND FILLED WITH FIRST MATERIAL IN BOTTOM PORTION AND WITH SECOND MATERIAL IN TOP PORTION

TECHNICAL FIELD

The disclosure relates to component carriers, a method of manufacturing a component carrier, and a semifinished product.

TECHNOLOGICAL BACKGROUND

In the context of growing product functionalities of component carriers equipped with one or more electronic components and increasing miniaturization of such components as well as a rising number of components to be mounted on or embedded in the component carriers such as printed circuit boards, increasingly more powerful array-like components or packages having several components are being employed, which have a plurality of contacts or connections, with ever smaller spacing between these contacts. Removal of heat generated by such components and the component carrier itself during operation becomes an increasing issue. At the same time, component carriers shall be mechanically robust and electrically reliable so as to be operable even under harsh conditions.

For embedding a component in a layer stack, a through hole can be formed in the layer stack and is closed from a bottom side by a temporary carrier such as an adhesive tape. A dielectric layer may be laminated on top of the stack and the component. Thereafter, the temporary carrier is released and thrown away.

SUMMARY

There may be a need for a component carrier being manufacturable simply and with low effort and having a strong mechanical integrity.

According to an exemplary embodiment of a first aspect of the invention, a component carrier is provided which comprises a core comprising a dielectric body, a component embedded at least partially in the core, a first dielectric layer being arranged at a bottom side of the core and of the component, and a second dielectric layer being arranged at a top side of the core and of the component, wherein a gap around the component in the core (in particular a lateral gap between the core and the component) is filled adjacent to the bottom side with material of the first dielectric layer and is filled adjacent to the top side with material of the second dielectric layer.

According to another exemplary embodiment of the first aspect of the invention, a method of manufacturing a component carrier is provided, wherein the method comprises providing a core, which comprises a dielectric body, with a through hole, attaching a sticky and at least partially uncured first dielectric layer to a bottom side of the core to thereby close the through hole, arranging a component at least partially in the closed through hole of the core by attaching the component to the sticky and at least partially uncured first dielectric layer, and thereafter permanently fixing the core, the component and the first dielectric layer to each other by laminating to thereby at least partially cure the first dielectric layer.

According to still another exemplary embodiment of the first aspect of the invention, a semifinished product for manufacturing a component carrier is provided, wherein the semifinished product comprises a core comprising a dielectric body and having a through hole, and a sticky and at least partially uncured first dielectric layer attached to a bottom side of the core and closing the through hole to thereby define an accommodation volume closed at a bottom side for attaching and embedding a component.

According to an exemplary embodiment of a second aspect of the invention, a component carrier is provided which comprises a core comprising a dielectric body and a patterned metal layer protruding downwardly beyond a bottom surface of the dielectric body, a component embedded at least partially in the core, and a first dielectric layer being connected at a bottom side of the core and of the component and covering the entire downwardly protruding patterned metal layer.

Overview of Embodiments

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. A component carrier may comprise a laminated layer stack. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "component" may particularly denote an inlay, for instance fulfilling an electronic and/or a thermal task. For instance, an electronic component may be a semiconductor chip comprising a semiconductor material, in particular as a primary or basic material. The semiconductor material may for instance be a type IV semiconductor such as silicon or germanium, or may be a type III-V semiconductor material such as gallium arsenide. In particular, the semiconductor component may be a semiconductor chip such as a naked die or a molded die.

In the context of the present application, the term "core" may particularly denote a rigid plate structure for a component carrier comprising a preferably fully cured dielectric body (such as a central plate) which may be covered on one or both opposing main surfaces thereof with a respective electrically conductive layer structure such as a patterned metal layer. For instance, the dielectric body may comprise resin (for instance epoxy resin) and reinforcing particles (for instance glass fibers or glass spheres), and may for instance be FR4. Optionally, two opposing main surfaces of a core may be electrically coupled with each other by a vertical through connection such as a copper plated laser via or a mechanically drilled and copper plated via. More specifically, a core of a component carrier such as a printed circuit board (PCB) may be a rigid base material being optionally laminated with copper on one or two sides. Such a core may be used for manufacturing single-sided and double-sided boards, but may also be used in the production of multi-layer component carriers (in particular PCBs).

In the context of the present application, the term "sticky first dielectric layer" may particularly denote a tape, film, foil, sheet, or plate having an adhesive surface. In use, the sticky layer may be used to be adhered to a main surface of a stack for closing an opening extending through the stack. The component may be adhered to the sticky layer for defining a position of the component in the opening and thus relative to the stack. By adhering the component on the sticky tape during the embedding process, the spatial accuracy of the embedding of the component may be excellent. Thus, a compact component carrier with high alignment accuracy may be obtained.

In the context of the present application, the term "at least partially uncured first dielectric layer" particularly denotes material which has the property to at least partially melt or become flowable by the application of elevated pressure and/or elevated temperature, and become fully hardened or cured (and thereby becomes solid) when releasing the applied elevated pressure and/or elevated temperature. Consequently, applying elevated pressure and/or elevated temperature may cause the curable or at least partially uncured material to become temporarily flowable, followed by a hardening (for instance an irreversible hardening in the case of thermoset-ting materials, wherein other materials may be used as well) upon releasing the applied high pressure and/or high temperature. In particular, the "at least partially uncured material" may comprise or consist of B-stage material and/or A-stage material. By providing the layer from resin, prepreg or any other B-stage material, the layer may re-melt during lamination so that resin (or the like) may flow for interconnecting the various elements and for closing gaps or voids and may therefore contribute to a stable intrinsic interconnection within the component carrier under manufacture. Upon connecting such a structure by the application of pressure and/or heat, i.e., by lamination, only the uncured material (in particular a low-flow resin or no-flow resin) will re-melt slightly and accomplish a local connection.

In the context of the present application, the term "semifinished product" may particularly denote an intermediate structure obtained during carrying out a method of manufacturing a component carrier. Hence, a semifinished product may be a preform of a readily manufactured component carrier, i.e., a structure which still needs processing before the manufacturing method for manufacturing a component carrier is completed.

According to exemplary embodiments of a first aspect of the invention, one or more components to be embedded in one or more through holes of a core may be immobilized within the component carrier from a bottom side by a first dielectric layer, preferably by lamination thereof. Descriptively speaking, said first dielectric layer may close the one or more through holes in the core and may have initially sticky or adhesive properties for simplifying assembly of the component(s) to be embedded. Highly advantageously, said first dielectric layer may be sticky and at least partially uncured when provisionally attaching the component(s) on the first dielectric layer. This ensures proper positioning of the component(s) to be embedded at a bottom side. By lamination, the previously at least partially uncured material of the first dielectric layer may be at least partially cured to thereby fix the respective component in place. During the manufacturing process, material from both the bottom dielectric layer and a top dielectric layer may flow around the component into gaps between the core, the component and the first dielectric layer so as to contribute to its fixation during embedding. In contrast to conventionally used temporary carriers, the initially sticky and at least partially uncured first dielectric layer may remain part of the readily manufactured component carrier, i.e., does not need to be removed at the end. This simplifies the manufacturing process and in particular a subsequent build-up from the bottom side of the component carrier and ensures a reliable embedding of the component.

According to an exemplary embodiment of a second aspect of the invention, a component carrier with at least one component embedded in a through hole in a dielectric body of a central core closed at a bottom side by a first dielectric layer may simultaneously use the same dielectric layer for covering a downwardly protruding patterned metal layer at a bottom side of the core. The bottom-sided patterned metal layer extending vertically beyond the dielectric body of the core may thus be hermetically surrounded by the dielectric body in combination with the dielectric layer. Hence, a core trace may be embedded within electrically insulating material and may thereby be mechanically protected and electrically insulated with regard to a surrounding. Furthermore, adhesion between dielectric layer and core may be promoted by the mechanical interlocking between dielectric layer and downwardly protruding elements of the patterned metal layer. This may prevent delamination and may also help to avoid warpage.

In the following, further exemplary embodiments of the manufacturing method, the component carriers, and the semifinished product will be explained.

In an embodiment, the gap comprises an intermingling or mixing region comprising intermingled or mixed material of the first dielectric layer and of the second dielectric layer. In said intermingling region, initially distinguishable material (in particular resin) of the first dielectric layer and further material (in particular further resin, which may be different from the aforementioned resin) of the second dielectric layer may flow together to form a mixture in the intermingling region comprising contributions from both dielectric layer materials. In such an intermingling region, a mixture of material of the first dielectric layer and material of the second dielectric layer may be present. In particular, the intermingling region may comprise a dual-resin or multi-resin material. Separated by the intermingling region, a pure first dielectric layer material region and a pure second dielectric layer material region may be present. Highly advantageously, the presence of an intermingling region mechanically strengthens the embedding of the component and provides a smooth transition between the material properties of the different dielectric layers. This avoids an abrupt material transition, which may be critical in terms of stress formation.

In an embodiment, the intermingling region is arranged between a bottom gap region comprising only material of the first dielectric layer and a top gap region comprising only material of the second dielectric layer. For instance, at least part of the intermingling region may be located next to a bottom side of the embedded component, for instance at an interface between a sidewall and a bottom wall of the component. Additionally or alternatively, the intermingling region may be at least partially located between opposing (in particular vertical) sidewalls of the embedded component and of the core, i.e., within a vertically extending lateral gap between component and core.

In an embodiment, a thickness of the first dielectric layer is in a range from 0.5 µm to 10 µm. Hence, the first dielectric layer covering the core and the embedded component from a bottom side may be extremely thin. This keeps the component carrier compact in a vertical direction.

In an embodiment, the first dielectric layer comprises resin, such as an epoxy resin. Preferably, the first dielectric layer is free of fibers such as glass fibers. This allows the resin material of the first dielectric layer to flow around the component properly and freely and/or into the gap between component and core during lamination. Such a resin layer may also be highly appropriate for intermingling with the second dielectric layer, for instance a further resin layer. Preferably, the first dielectric layer comprises B-stage resin before lamination to the core and the component. Thereafter, the resin of the first dielectric layer may be fully cured.

In an embodiment, the first dielectric layer comprises filler particles. Advantageously, such filler particles may limit the flowability of the resin material of the first dielectric layer and thereby allow flow control. This may improve controllability of the manufacturing process. For instance, said filler particles may be functional filler particles providing the first dielectric layer with an additional technical function. As an example, the filler particles may be configured for increasing the thermal conductivity of the first dielectric layer (which may be larger than without the filler particles). For this purpose, the filler particles may be ceramic filler particles, for example comprising aluminum oxide or aluminum nitride.

In an embodiment, the second dielectric layer is a pure resin layer. In particular, the second dielectric layer may be free of fibers (such as glass fibers) and/or may be free of filler particles. This allows the resin material of the second dielectric layer to flow around the component properly and freely and/or into the gap between component and core during lamination. Such a resin layer may also be highly appropriate for intermingling with the first dielectric layer, for instance a further resin layer. In particular, the first dielectric layer and the second dielectric layer may be made of different materials.

In an embodiment, the core comprises a patterned metal layer on and/or in a bottom surface of the dielectric body. In particular, the first dielectric layer may cover the entire patterned metal layer. For example, such a patterned metal layer may be a structured copper foil. The first dielectric layer may cover all exposed surface portions of the patterned metal layer to ensure electrical insulation and mechanical protection. The patterned metal layer may partially or entirely protrude downwardly beyond the dielectric body of the core, or may have an exposed surface in alignment with or in flush with the bottom main surface of the dielectric body.

In an embodiment, the core comprises a further patterned metal layer on and/or in a top surface of the dielectric body. For example, said further patterned metal layer may be a structured copper foil. The second dielectric layer may cover all exposed surface portions of the further patterned metal layer to ensure electrical insulation and mechanical protection. The further patterned metal layer may partially or entirely protrude upwardly beyond the dielectric body of the core, or may have an exposed surface in alignment with or in flush with the top main surface of the dielectric body.

In an embodiment, at least one of the patterned metal layer and the further patterned metal layer is protruding less than 18 μm, in particular less than 10 μm from a surface of the core. This may allow to limit the dimension of the component carrier in a vertical direction.

For instance, a thickness of at least one of the patterned metal layer and the further patterned metal layer is less than 5 μm, in particular less than 2 μm. Thus, a respective structured metal layer on the top side and/or on the bottom side of the core may be extremely thin and may thereby also contribute to a compact design of the component carrier.

In one embodiment, the patterned metal layer and the further patterned metal layer may be electrically isolated with respect to each other. In another embodiment, however, the patterned metal layer and the further patterned metal layer may be electrically coupled with each other, in particular by an electrically conductive vertical through connection extending vertically through the dielectric body of the core. For instance, the vertical through connection may be a plated through hole. Such a configuration provides a very short electric connection path between the patterned metal layers on the opposing main surfaces of the dielectric body in the vertical direction.

In an embodiment, a sidewall of the component and/or a sidewall of the dielectric body is covered partially with material of the first dielectric layer and partially with material of the second dielectric layer. More specifically, a bottom portion of the vertical sidewall of the embedded component may be covered with material of the first dielectric layer only (due to a reflow of said dielectric material during lamination). Correspondingly, a top portion of the vertical sidewall of the embedded component may be covered with material of the second dielectric layer only (due to a reflow of said dielectric material during lamination). Optionally but preferably, an intermingling region with a mixture of dielectric material of the first dielectric layer and dielectric material of the second dielectric layer may be present between the pure first dielectric layer material and the pure second dielectric layer material.

In an embodiment, the method comprises attaching the sticky and at least partially uncured first dielectric layer with a detachable support layer below to the bottom side of the core for closing the through hole. Correspondingly, the semifinished product may comprise a detachable support layer below the first dielectric layer. The sticky property of the first dielectric layer may also ensure adhesion between the first dielectric layer and the support layer. Descriptively speaking, such a support layer beneath the sticky and at least partially uncured first dielectric layer may provide additional stability when attaching the sticky and at least partially uncured first dielectric layer to the bottom side of the recessed core.

In an embodiment, the method comprises detaching the detachable support layer from the first dielectric layer after the laminating. Contrary to the sticky and at least partially uncured first dielectric layer, which may form part of the readily manufactured component carrier, the support layer may be a temporary carrier which may be removed before completing manufacture of the component carrier.

In an embodiment, the method comprises reusing the detached support layer for manufacturing a further component carrier. Highly advantageously, the support layer may hence be recycled and may be used again as a temporary carrier for one or more subsequent batches of component carriers to be manufactured. This reduces the ecological footprint and the amount of waste.

In an embodiment, the support layer is a plastic layer, in particular made of polyethylene terephthalate (PET). Such a material is properly releasable and capable of withstanding the harsh conditions during lamination. However, other detachable support layers, such as support layers of other plastics (for instance polytetrafluoroethylene (PTFE)) and/or non-plastic materials (for instance a metal, a ceramic, FR4) may be implemented as well.

In a preferred embodiment, a B-stage resin layer on a PET support layer may form a double layer constituting the first dielectric layer on the support layer. Such a double layer may be connected as a whole with the core, and the support layer may be detached after assembly of the component and after lamination of the first dielectric layer, when the latter is no longer sticky.

In an embodiment, the method comprises attaching a second dielectric layer to a top side of the core and of the component. Advantageously, the method may comprise permanently fixing the core, the component, the first dielectric layer, and the second dielectric layer with each other by the laminating, in particular for at least partially curing the second dielectric layer. Preferably, the first dielectric layer and the second dielectric layer may be connected with the core and the component by one common simultaneous lamination process, and hence in a quick and simple way. Moreover, such a common lamination process may also allow to establish a direct physical connection between the laminated first dielectric layer and the laminated second dielectric layer. This may improve the overall mechanical integrity of the component carrier. By simultaneously curing the first dielectric layer and the second dielectric layer by lamination, also the formation of an intermingling region may be promoted or triggered.

In an embodiment, the patterned metal layer is entirely embedded within the dielectric body. Such an embodiment is shown for instance in FIG. 1 and results in a particularly flat and compact design of the component carrier.

Figure 19:
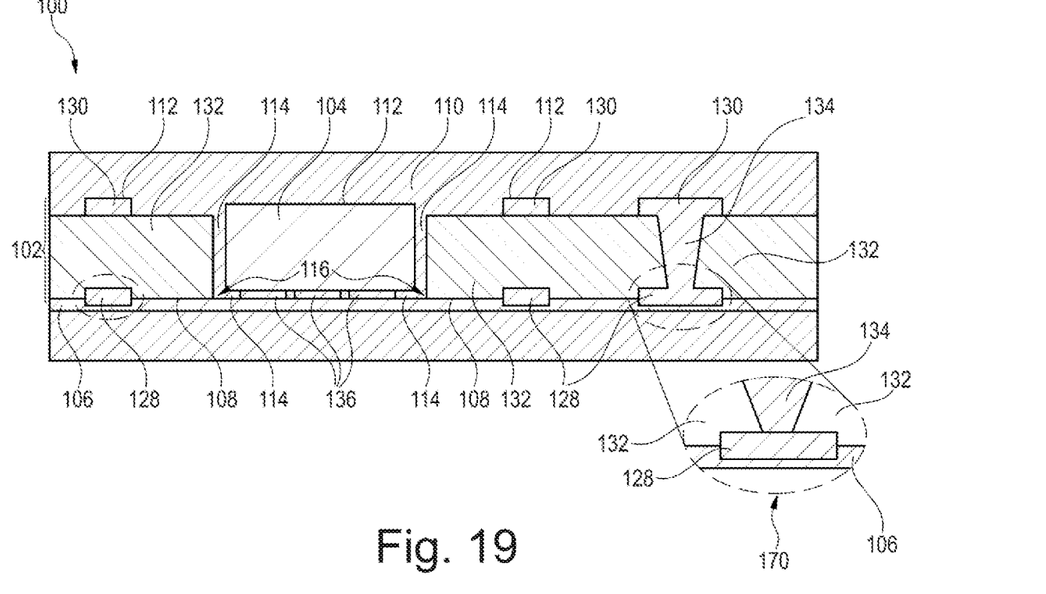
FIG. 19 and FIG. 20 illustrate cross-sectional views of component carriers according to other exemplary embodiments of the invention.

In another embodiment, the patterned metal layer is only partially embedded within the dielectric body, compare for example the embodiment of FIG. 19. Alternatively, the patterned metal layer is completely arranged below the dielectric body, see for instance the embodiment of FIG. 20. In the latter described embodiments, the first dielectric layer may properly protect the mentioned patterned metal layer while simultaneously improving the overall integrity of the component carrier by mechanically interlocking with the protruding patterned metal layer.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g. based on polyphenylenether, PPE), polyimide (PI), polyamide (PA), liquid crystal polymer (LCP), polytetrafluoroethylene (PTFE) and/or a combination thereof. Rein-forcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat exchange capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide-semiconductor field-effect transistor (MOSFET), complementary metal-oxide-semiconductor (CMOS), junction field-effect transistor (JFET), or insulated-gate field-effect transistor (IGFET), all based on semiconductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

BRIEF DESCRIPTION OF THE DRAWINGS

FIG. 1, FIG. 2, FIG. 3, FIG. 4, FIG. 5, and FIG. 6 illustrate cross-sectional views of structures obtained during carrying out, starting from a semifinished product according to FIG.

1, a method of manufacturing a component carrier, shown in FIG. 6, according to exemplary embodiments of the invention.

DETAILED DESCRIPTION OF ILLUSTRATED EMBODIMENTS

The illustrations in the drawings are schematically presented. In different drawings, similar or identical elements are provided with the same reference signs.

Before, referring to the drawings, exemplary embodiments will be de-scribed in further detail, some basic considerations will be summarized based on which exemplary embodiments of the invention have been developed.

Conventionally, a temporary carrier, such as an adhesive tape, may be used to fix a component at a desired position within a through hole formed in a core. This generates the need for subsequent tape removal and panel surface cleaning from potential residues. A result of such an approach is a relatively large amount of waste and a relatively high procedural effort.

It would thus be desired to avoid the use of a temporary tape material in an embedding process.

According to an exemplary embodiment of the invention, a component carrier with a component embedded in a core is provided, in which a through hole of the core for accommodating the component is closed by a sticky and at least partially uncured first dielectric layer, which is laminated to the core and the components during embedding and thereby forms part of the readily manufactured component carrier rather than being removed before completing manufacture. A temporary carrier which must be disposed after use may thus be dispensable, so that the amount of waste can be significantly reduced. Furthermore, laminating said first dielectric layer on the bottom side of the component carrier while simultaneously laminating a second dielectric layer to the top side of the component carrier may result in a circumferential embedding of the component in resin material of both said dielectric layers. Consequently, the sensitive component can be reliably protected within a multi-material dielectric shell. Highly advantageously, resin(s) of both dielectric layers may intermingle in an intermingling region and may thereby prevent abrupt material bridges and may ensure a smooth continuous material transition.

Yet another aspect of embodiments of the invention encompasses an embodiment in which a patterned metal layer protrudes downwardly from a dielectric body of a core of a component carrier and is accommodated within dielectric material of a first dielectric layer on the bottom side of the component carrier, for instance having the above-described properties.

Exemplary embodiments of the invention provide the advantages of a low to no component shift during embedding. Furthermore, a simple PET removal process may be executed for removing a support layer which may be connected temporarily to an initially sticky and at least partially uncured first dielectric layer. Moreover, a good process yield may be obtained by exemplary embodiments of the invention. The described manufacturing process may be precisely controlled.

Hence, an exemplary embodiment of the invention accomplishes com-ponent embedding with an adhesive dielectric build-up material, which may also be denoted as first dielectric layer.

A gist of an exemplary embodiment is to use B-stage resin material in its sticky phase to laminate on bottom of a panel for subsequent component fixing purposes. A proper condition for such a manufacturing architecture is a core with embedded traces of very low copper thickness (for instance with a thickness of smaller than 5 µm) and a sticky resin sheet with small thickness (for example below 10 µm, preferably in a range from 1 µm to 4 µm). Thus, the sticky B-stage resin of the first dielectric layer may functionally substitute the above-mentioned adhesive tape and may cure only together with an opposite second dielectric layer upon being pressed during an embedding process. Highly advantageously, such an approach has turned out to significantly improve the warpage performance. Furthermore, a material removal process may be dispensable, since the previously sticky and at least partially uncured first dielectric layer forms part of the readily manufactured component carrier. In particular, no tape material has to be used during embedding in the core. Advantageously, this may reduce the amount of waste material. Furthermore, there is no need for tape removal equipment according to exemplary embodiments of the invention. Beyond this, there is no need for a panel cleaning process after tape removal, for instance for removing residues. Highly advantageously, exemplary embodiments of the invention relax the complexity of packaging technology, reduces waste, and reduces the manufacturing effort.

Descriptively speaking, an exemplary embodiment uses sticky dielectrics for embedding applications. Hence, an exemplary embodiment of the invention implements an epoxy-based carrier layer which may be used to hold the component after the assembly process and remains in the PCB build-up as a dielectric layer. In embodiments, the epoxy-based carrier layer not only acts as carrier for the component to be embedded, but also as dielectric material in the final build-up of the manufactured component carrier. This epoxy-based carrier layer may be sticky on the surface when uncured or semi-cured, and may turn rigid when fully cured. With these properties, a sticky and at least partially uncured dielectric layer may function as a multi-purpose material for embedding applications. Highly advantageously, since the sticky and at least partially uncured dielectric layer may form part of the component carrier after curing, there is no need to peel off the component carrier. Synergistically, it may be additionally possible to use this epoxy carrier layer as a dielectric material of the readily manufactured component carrier. As a result, the number of processing stages may be reduced, which may reduce, in turn, the manufacturing effort. Moreover, there is no risk for tape residues. Furthermore, the amount of waste may be significantly reduced. Advantageously, there is also a smaller ecological footprint by saving energy, water and base material.

According to a preferred embodiment, it may be possible to embed a component in a core, which may be placed on a sticky and at least partially uncured dielectric layer. Preferably, the latter may be a B-stage resin (like uncured epoxy or cyanate ester resins) with filler particles to limit the flowability of the material. Advantageously, the thickness of the dielectric material may be selected to be as thin as 0.5 µm to 10 µm.

In a next process stage, the embedding may then be finished by laminating another B-stage resin onto the surface of the build-up. In this context, a PET film may function as a support or carrier for the B-stage resin. In an embodiment, it may be possible to use dielectric material with PET film as backup material. The thickness of the first dielectric layer may be very low (for instance in a range from 2 µm to 7 µm). Furthermore, it may be possible to build a final dielectric thickness in a subsequent process stage.

According to an exemplary embodiment of the invention, it may be possible to substitute a conventional temporary adhesive tape while using a PET foil with thin B-stage dielectric that exhibits adhesion. The adhesion property may be utilized to both attach the sticky layer on the bottom of the cavity cut core as well as to attach the component subsequently.

Moreover, film lamination of the sticky and at least partially uncured dielectric layer can be accomplished. The mentioned film (for instance a PET foil) may function as backing material for the thin adhesive dielectric layer. During such a process, it may be advantageous to apply the film without generating wrinkles. This is possible by using a tape laminator (for example with reduced pressure for instance 0.5 MPa, and a speed in a range from 1 m/min to 2 m/min). An advantageous selection of the material of the adhesive dielectric layer is an Ajinomoto Build-up Film (ABF)® material GY50 that exhibits stickiness at room temperature. Ajinomoto Build-up Film and Ajinomoto Build-up Film (ABF) are registered marks of Ajinomoto Co., Inc. of Tokyo, Japan. Preferably, the adhesive dielectric layer is provided with a low thickness (for instance in a range from 1 µm to 10 µm) to ensure flexibility during handling and low or no flow in a press.

In the press, a preferred configuration to mitigate component shift is a core face down orientation. This may promote or support filling resin from bottom to top, thus eliminating any undesired uncontrolled resin flow in the component cavity.

Figure 1:
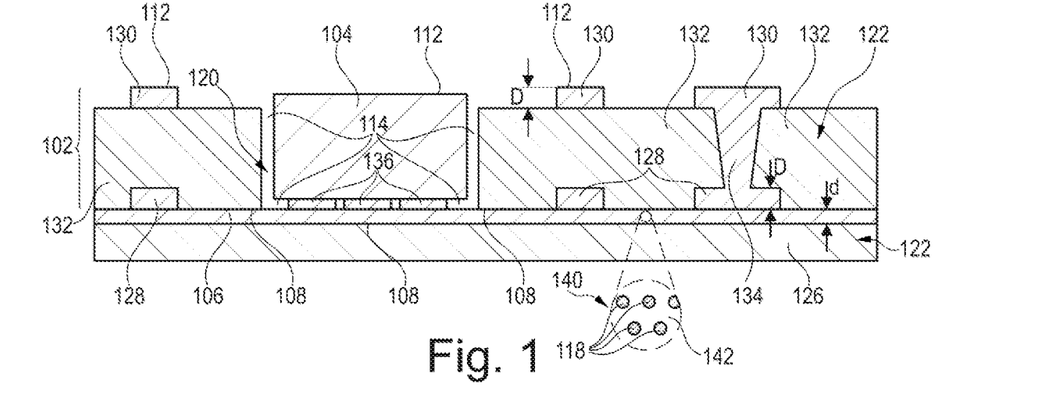
Figure 4:
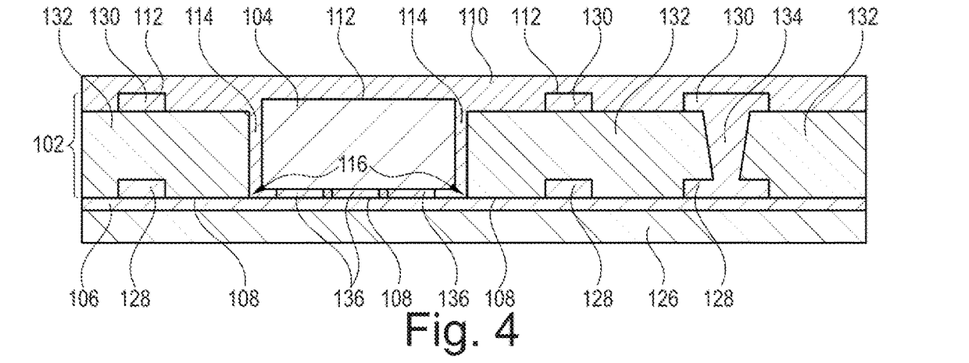
Figure 5:
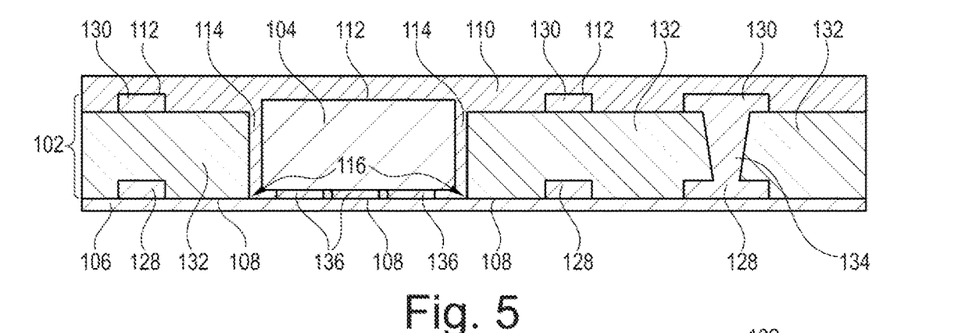
Figure 6:
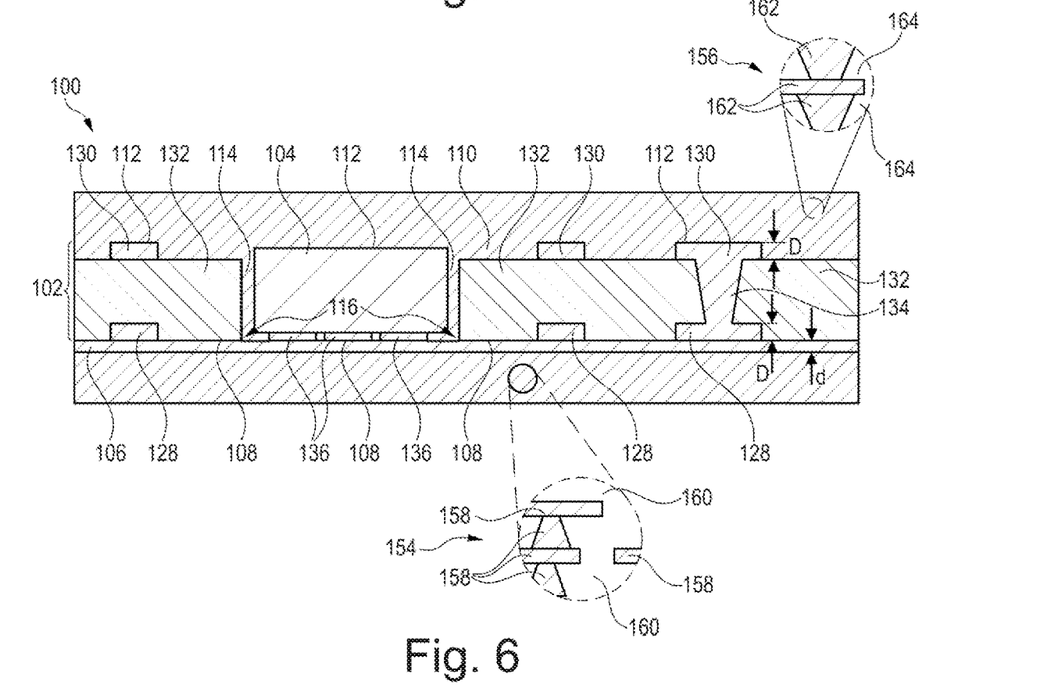

FIG. 1 to FIG. 6 illustrate cross-sectional views of structures obtained during carrying out, starting from a semifinished product 122 according to FIG. 1, a method of manufacturing a component carrier 100, shown in FIG. 6, according to exemplary embodiments of the invention.

FIG. 1 shows a structure obtained by forming a through hole 120 in a core 102 which comprises a dielectric body 132. Formation of through holes 120 may be accomplished for example by mechanically cutting or laser cutting. For instance, the dielectric body 132 may be a plate of fully cured resin, for instance epoxy resin, comprising reinforcing particles such as glass fibers. As shown, a patterned metal layer 128 is provided at a lower main surface of the dielectric body 132. In the shown embodiment, the patterned metal layer 128 is embedded in the dielectric body 132 with surface access so that an exposed surface portion of the patterned metal layer 128 is aligned with or is in flush with the lower main surface of the dielectric body 132. As shown as well, a further patterned metal layer 130 is formed at an upper main surface of the dielectric body 132. In the shown embodiment, the further patterned metal layer 130 is formed on and vertically protrudes beyond the dielectric body 132. Each of the patterned metal layer 128 and the further patterned metal layer 130 may be a copper foil or may be a layer of plated copper being structured, for instance by etching. For example, a thickness D of the patterned metal layer 128 and/or of the further patterned metal layer 130 may be less than 5 µm, for instance 3 µm. This contributes to the compactness of the component carrier 100 being manufactured. FIG. 1 also illustrates that an electrically conductive vertical through connection 134 extends through the entire dielectric body 132 for electrically coupling the patterned metal layer 128 with the further patterned metal layer 130. For example, the vertical through connection 134 may be a copper filled laser via.

Only one through hole 120 is visible in FIG. 1. However, the described manufacturing process can be a batch process for manufacturing a plurality of component carriers 100 simultaneously. In particular, the core 102 may be a panel comprising a two-dimensional array of through holes 120 of the type shown in FIG. 1, wherein a plurality of component carriers 100 may be formed at the same time and may be separated or singularized at the end of the manufacturing process. This increases the throughput of the manufacturing process. For instance, the panel-sized core 102 may have a dimension of at least 12×18 inches$^2$, for instance 18×18 inches$^2$ or more.

After having formed the through hole(s) 120 in the core 102, a double layer composed of a sticky and at least partially uncured first dielectric layer 106 connected with a detachable support layer 126 is adhered to a bottom side 108 of the core 102 to close the through hole 120. Consequently, a cavity with closed bottom and sticky bottom wall is obtained.

For instance, the sticky and at least partially uncured first dielectric layer 106 is a layer of uncured epoxy resin, i.e., epoxy resin which is still capable of cross-linking or polymerizing by supplying heat and/or mechanical pressure. Preferably and as shown in a detail 140 of FIG. 1, the first dielectric layer 106 comprises uncured resin 142, is free of glass fibers, but may be filled with filler particles 118. In particular, the resin 142 of the first dielectric layer 106 may comprise B-stage resin. The uncured resin 142 may provide the sticky property and may allow to connect to various constituents of the component carrier 100 being presently manufactured during lamination. Further advantageously, the absence of glass fibers in the first dielectric layer 106 allows a proper flowability during lamination, so as to contribute to the closure of gaps 114 between a component 104, core 102 and first dielectric layer 106 during lamination. Advantageously, filler particles 118 of the first dielectric layer 106 may limit flowability of resin 142 in a defined way so that excessive and uncontrolled resin flow may be prevented during lamination. For instance, the filler particles 118 may be ceramic filler particles (for instance made of aluminum oxide or aluminum nitride) for enhancing thermal conductivity and thereby contributing to heat removal during operation of the readily manufactured component carrier 100. Preferably, a thickness d of the first dielectric layer 106 may be very small, for instance may be in a range from 0.5 µm to 10 µm, for example 2 µm. This keeps the manufactured component carrier 100 compact in a vertical direction.

The support layer 126 may be a detachable plastic layer of a non-sticky material, preferably polyethylene terephthalate (PET). Such a material is sufficiently non-adhesive for being detached easily after lamination. Furthermore, the described material is mechanically robust to provide mechanical stability prior to lamination. Furthermore, the support layer 126 may be reused or recycled after detaching for being usable for manufacturing a further batch of component carriers 100. Descriptively speaking, first dielectric layer 106 may be a permanent carrier closing the through hole 120 and carrying a component 104 in an adhesive way while forming part of the readily manufactured component carrier 100. In contrast to this, support layer 126 may be a temporary carrier providing mechanical support to the first dielectric layer 106 and the component 104, but being removed before completing manufacture of the component carrier 100.

After having attached the described double layer to the bottom side of the cut core 102 for defining the above-described cavity with closed bottom, an electronic component 104 may be inserted in the closed through hole 120 of the core 102 and may be attached to the exposed sticky surface of the sticky and at least partially uncured first dielectric layer 106. Thus, assembly of the electronic component 104 may be accomplished in a way that the assembled electronic component 104 adheres to the first dielectric layer 106 and is thereby prevented from being spatially misaligned. In other words, the electronic component 104 inserted into the closed through hole 120 may be provisionally connected to the first dielectric layer 106 for defining its position prior to lamination. For example, the electronic component 104 may be a semiconductor chip, in particular a non-encapsulated naked die. The electronic component 104 may have one or more electrically conductive pads 136 on one or both opposing main surfaces. In the shown embodiment, the electronic component 104 has pads 136 only on the lower main surface thereof, i.e., is assembled face-down.

FIG. 1 illustrates a semifinished product 122 obtained as an intermediate structure during manufacturing a component carrier 100. The shown semifinished product 122 is composed of the sticky and at least partially uncured first dielectric layer 106 attached to the bottom side 108 of the core 102 and closing the through hole 120 to thereby define a bottom-sided closed accommodation volume for embedding component 104. Furthermore, the detachable support layer 126 below the first dielectric layer 106 forms part of the semifinished product 122 according to FIG. 1.

As described, FIG. 1 shows core 102 with laminated sticky resin sheet, in form of first dielectric layer 106, and component 104 mounted in a cavity delimited by core 102 and first dielectric layer 106. Preferably, the core 102 is provided with a very low copper thickness of patterned metal layers 128, 130 (preferably having a thickness of 5 μm or less). Advantageously, embedding patterned metal layer 128 within dielectric body 132 of core 102 with surface access allows to use for first dielectric layer 106 a sticky B-stage resin sheet with strongly limited thickness (for instance in a range from 1 μm to 10 μm). In other words, when the copper material of the patterned metal layer 128 is located or embedded inside of the dielectric body 132, this allows to use a very thin B-stage resin sheet as first dielectric layer 106. Hence, the described embedded trace core design may be highly preferred. It may be desirable to prevent that the copper material of the patterned metal layer 128 protrudes downwardly beyond first dielectric layer 106, to ensure that the lamination process can be carried out highly efficiently. Descriptively speaking, a very thin first dielectric layer 106 may behave similar as a tape and may be prevented from excessive movement. Preferably, first dielectric layer 106 may be filled with filler particles 118 for limiting the tendency of resin 142 to flow during subsequent lamination. More specifically, a high filler content (in particular a filler content of at least 50 weight percent, in relation to the overall weight of the first dielectric layer 106) may contribute to limit resin flow during lamination. Low flow or even no flow properties of the first dielectric layer 106 may be preferred. Support layer 126, which may be preferably made of PET, may function as backing material for an epoxy-based resin which may be used for the first dielectric layer 106.

Figure 2:
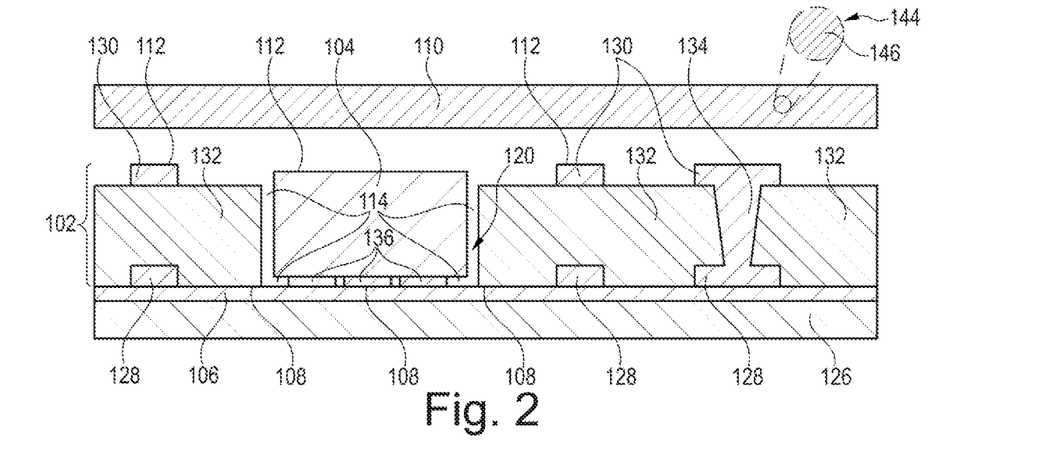

Referring to FIG. 2, a second dielectric layer 110 may be provided for subsequent attachment to a top side 112 of the core 102 and of the component 104. For example, the second dielectric layer 110 is a pure resin layer, which may be free of glass fibers and free of filler particles. This may ensure proper flowability characteristics during subsequent lamination. Detail 144 shows the pure resin 146 of second dielectric layer 110. More generally, first dielectric layer 106 and second dielectric layer 110 may be made of the same materials or may be made of different materials.

The arrangement shown in FIG. 2 may be inserted into a press of a laminator device with the resin sheet in form of second dielectric layer 110 being arranged on the opposite side to the sticky B-stage resin sheet constituting first dielectric layer 106.

Figure 3:
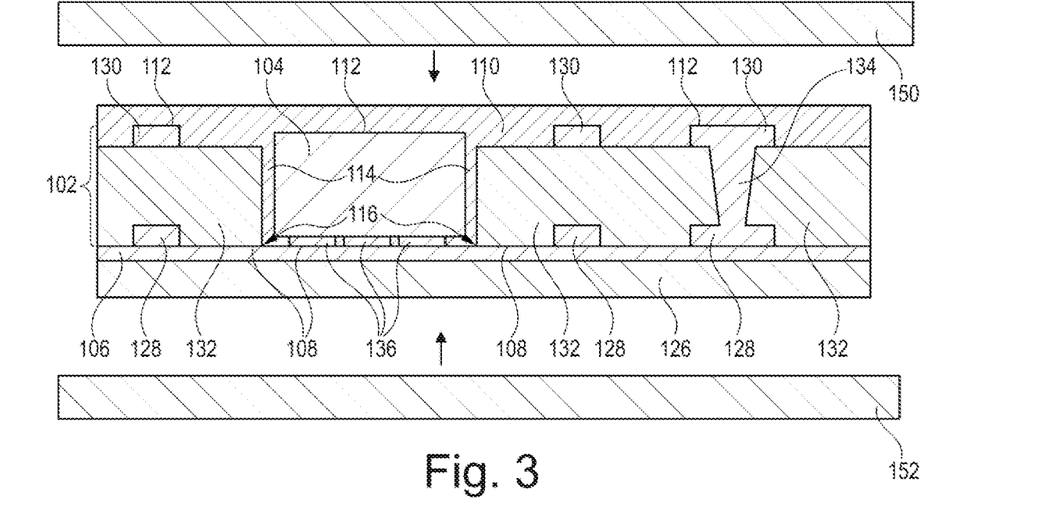

As shown in FIG. 3, the second dielectric layer 110 is attached to the top side 112 of the core 102 and of the component 104 by lamination, for instance using heated lamination presses 150, 152. Hence, the core 102, the component 104, the first dielectric layer 106, and the second dielectric layer 110 may be connected or fixed with each other by laminating for simultaneously curing the first dielectric layer 106 and curing the second dielectric layer 110. Curing by lamination may be accomplished by the application of mechanical pressure and/or heat. Descriptively speaking, the previously uncured resins 142, 146 of dielectric layers 106, 110 may become flowable by the influence of pressure and/or heat, may start cross-linking or polymerizing, and may then resolidify. During the described lamination process, the resins 142, 146 of dielectric layers 106, 110 may flow into the tiny gaps 114 between core 102, component 104, first dielectric layer 106 and second dielectric layer 110. During lamination, said gaps 114 may be filled partially or entirely with resin 142, 146, preferably in a void-free way. As a result of the shown geometrical arrangement, a lower gap region may be filled with resin of first dielectric layer 106, whereas an upper gap region may be filled with resin of second dielectric layer 110. In an interface region between said lower gap region (comprising pure resin 142 of first dielectric layer 106, optionally with filler particles 118) and said upper gap region (comprising pure resin 146 of second dielectric layer 110), an intermingling region 116 may be formed comprising a mixture of resin 142 of first dielectric layer (optionally with filler particles 118) and resin 146 of the second dielectric layer 110. Descriptively speaking, resin 142 and resin 146 may become flowable during lamination and may at least partially flow into each other to thereby form intermingling region 116 with heterogeneous resin properties. The (in particular vertical) position of the intermingling region 116 may broadly vary, in particular depending on the flowability characteristics of the resins 142, 146 of the dielectric layers 106, 110 and/or on the presence or absence as well as the amount of filler particles 118 in dielectric layer(s) 106 and/or 110. For instance, the position of the intermingling region 116 may be in the vertical gap region in which vertical sidewalls of the core 102 and of the component 104 oppose each other in a parallel way, separated by the gap 114. However, it may also be possible that, as illustrated in FIG. 3, the position of the intermingling region 116 is at an interface between the bottom main surface and the sidewalls of the component 104.

Hence, a pressing process is finalized according to FIG. 3. In different embodiments, resin sheets can be used on both sides (for example ABF material), i.e., for both dielectric layers 106, 110. This may make it possible to process the obtained structure later by semi-additive processing (SAP). It is also possible to use a resin coated foil (RCF) or resin coated copper (RCC). Furthermore, it may be possible to process a dielectric build up in two stages for further improving warpage performance.

Referring to FIG. 4, lamination presses 150, 152 are removed after encapsulation by lamination.

As mentioned above, the described embodiment uses a core 102 with embedded traces on the bottom side realized by patterned metal layer 128. It is also possible to use a high copper density and low copper thickness. A benefit of the illustrated embodiment is that a low thickness of the B-stage dielectric material of first dielectric layer 106 may efficiently limit shift of the component 104 during processing. The advantageous combination of support layer 126 as backing material and thin adhesive material as first dielectric layer 106 may resemble the conventional use of an adhesive temporary tape and may advantageously eliminate the risk of tape residues and the need of a dedicated tape removal process. In contrast to this, a subsequently described PET peel off process for removing temporary support layer 126 after lamination is very simple and allows recycling of the PET-type support layer 126 for reducing waste. During encapsulation or lamination, PET-type support layer 126 functions for backing the B-stage dielectric thin film in form of first dielectric layer 106 during encapsulation or lamination.

In order to obtain the structure shown in FIG. 5, the non-sticky releasable or detachable support layer 126 may be detached from the first dielectric layer 106 after the laminating by simply peeling it off. This avoids any undesired residues remaining at the obtained preform of component carrier 100. Moreover, it may be possible to reuse the detached support layer 126 for manufacturing a further batch of component carriers 100, for instance in the way as described referring to FIG. 1 to FIG. 5. Advantageously, after PET removal (or removal of other backing material), the support layer 126 can be recycled and reused. In another embodiment, support layer 126 can be made of copper, which can be etched after encapsulation to allow further dielectric thickness buildup. The support layer 126 (for instance made of PET or any other appropriate backing material) may thus be removed prior to further build-up.

Now referring to FIG. 6, the structure obtained according to FIG. 5 may be subjected to a further build-up of layer structures on one or both opposing main surfaces of the structure of FIG. 5, preferably by lamination. As shown in a detail 154, a build-up on the bottom side of the obtained component carrier 100 may comprise at least one electrically conductive layer structure 158 and/or at least one electrically insulating layer structure 160. Correspondingly and as shown in a detail 156, a build-up on the top side of the obtained component carrier 100 may comprise at least one electrically conductive layer structure 162 and/or at least one electrically insulating layer structure 164.

As mentioned, the laminated stacks on both opposing main sides of core 102 comprise electrically conductive layer structures 158, 162 and electrically insulating layer structures 160, 164. For example, the electrically conductive layer structures 158, 162 may comprise patterned copper foils (and optionally one or more vertical through connections, for example copper filled laser vias). The electrically insulating layer structures 160, 164 may comprise a resin (such as epoxy resin), optionally comprising reinforcing particles therein (for instance glass fibers or glass spheres). For instance, the electrically insulating layer structures 160, 164 may be made of prepreg or FR4. The layer structures 158, 160, 162, 164 may be connected by lamination, i.e., the application of pressure and/or heat.

It is also possible that the described build-up is accomplished using resin film lamination (on the top side and/or on the bottom side). What concerns the dielectric build-up, B-stage resin lamination is possible on both sides (for instance using epoxy-based-type dielectrics and/or prepreg with copper foils).

The manufacturing process for obtaining component carrier 100 may then be completed, for instance by carrying out processes such as laser drilling, etc.

As a result of the described manufacturing process, plate-shaped laminate-type component carrier 100 according to FIG. 6 is obtained, which is here embodied as a printed circuit board (PCB).

Component carrier 100 comprises the central core 102 with its dielectric body 132 in which a through hole 120 has been formed. The electronic component 104 is embedded in the through hole 120 of the core 102. On the bottom side 108 of the core 102 and of the component 104, the laminated and cured first dielectric layer 106 is connected. On the top side 112 of the core 102 and of the component 104, the laminated and cured second dielectric layer 110 is connected. The gaps 114 between the core 102 and the component 104 as well as below the component 104 are filled adjacent to the bottom side 108 only with homogeneous material of the first dielectric layer 106 and are filled adjacent to the top side 112 only with homogeneous material of the second dielectric layer 110. This geometry is obtained by reflow of resin material of previously uncured dielectric layers 106, 110 during lamination.

As already described above, the gaps 114 comprise an intermingling region 116 comprising intermingled heterogeneous resin material of the first dielectric layer 106 and of the second dielectric layer 110, i.e., a mixed resin zone. Generally, the intermingling region 116 may be arranged between a bottom gap region comprising only material of the first dielectric layer 106 and a top gap region comprising only material of the second dielectric layer 110. The exact position of the intermingling region 116 depends on the composition of the dielectric layer 106, 110, in particular of the type of resins 142, 146 and the presence and/or absence of filling particles 118. For instance, a bottom wall and a sidewall of the component 104 may be covered partially with material of the first dielectric layer 106 and partially with material of the second dielectric layer 110. Advantageously, the intermingling of the resins 142, 146 avoids an abrupt material bridge and ensures a smooth material transition. This also suppresses thermal stress which may occur at such an abrupt interface.

Furthermore, the core 102 comprises the bottom-sided patterned met-al layer 128 covering part of a bottom surface of the dielectric body 132. As shown, the first dielectric layer 106 covers the entire patterned metal layer 128 and thereby protects the latter mechanically and electrically. Advantageously, the patterned metal layer 128 is entirely embedded within the dielectric body 132 with aligned outer surfaces, and exposed surface portions of the patterned metal layer 128 are covered by the first dielectric layer 106.

Furthermore, the core 102 comprises top-sided further patterned metal layer 130 covering part of a top surface of the dielectric body 132. In the shown embodiment, the further patterned metal layer 130 is completely arranged above the dielectric body 132. Advantageously, the second dielectric layer 110 covers the entire further patterned metal layer 130 and thereby protects the latter mechanically and electrically.

Figure 7:
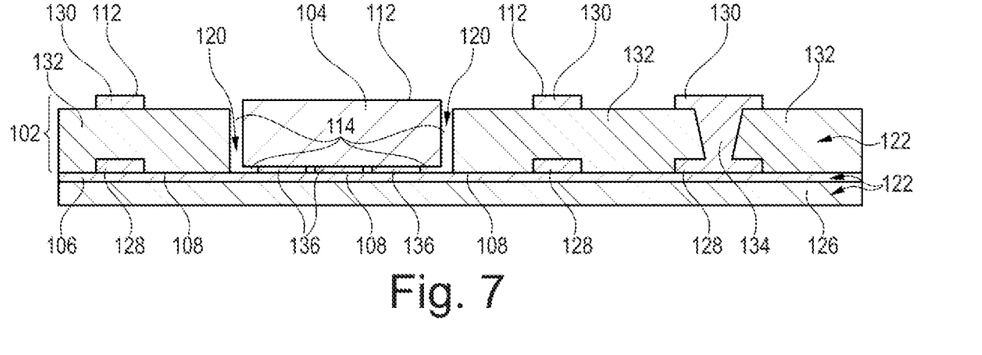
FIG. 7, FIG. 8, FIG. 9, FIG. 10, FIG. 11, and FIG. 12 illustrate cross-sectional views of structures obtained during carrying out, starting from a semifinished product according to FIG. 7, a method of manufacturing a component carrier, shown in FIG. 12, according to other exemplary embodiments of the invention.
Figure 10:
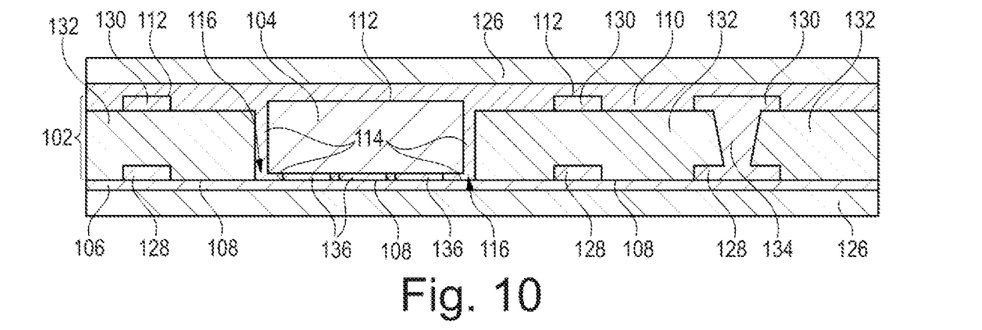
Figure 11:
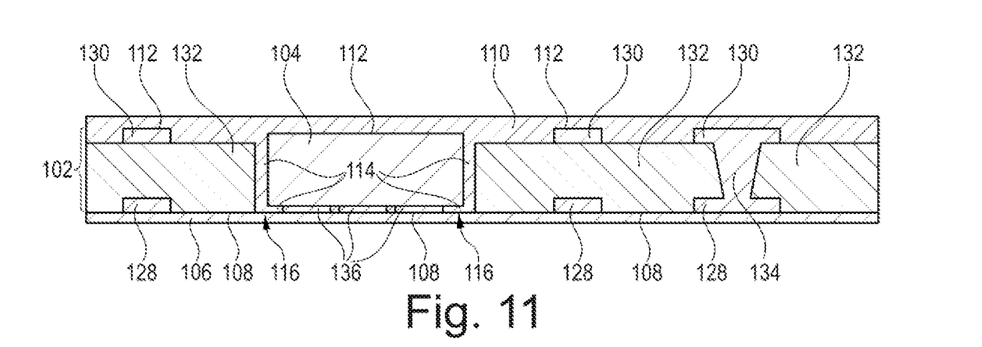
Figure 12:
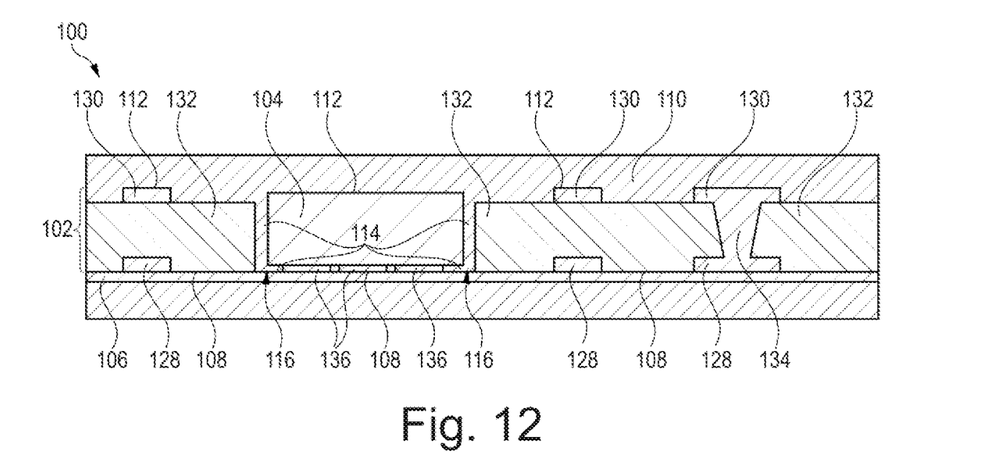

FIG. 7 to FIG. 12 illustrate cross-sectional views of structures obtained during carrying out, starting from a semifinished product 122 according to FIG. 7, a method of manufacturing a component carrier 100, shown in FIG. 12, according to another exemplary embodiment of the invention.

Referring to FIG. 7, a structure corresponding to FIG. 1 is shown.

Figure 8:
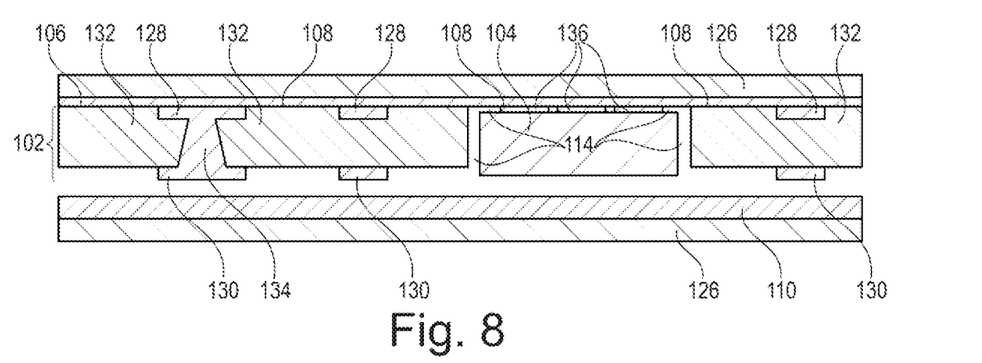

Referring to FIG. 8, the structure according to FIG. 7 is turned upside down and is arranged to face a double layer composed of a support layer 126 (for instance a PET foil or plate) and a sticky and at least partially uncured second dielectric layer 110. Due to the small resin thickness of the first dielectric layer 106, the force of gravity will not cause detachment, as there is a wetting force to hold the resin 142 of the first dielectric layer 106 to the connected support layer 126, i.e., on the surface of the backing material. The second dielectric layer 110, embodied as further resin sheet, is oriented face down, will avoid a shift of the component 104 and will serve as a source of filling medium during lamination.

Figure 9:
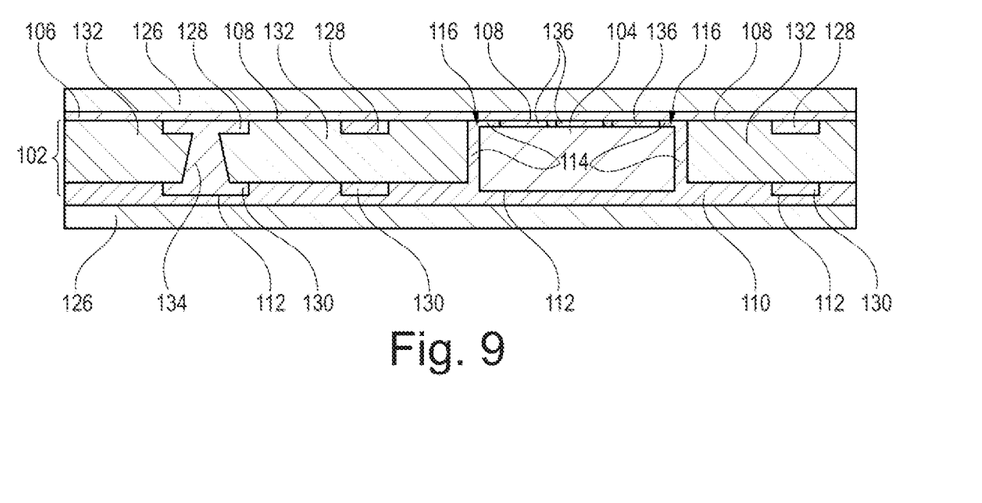

Referring to FIG. 9, the constituents of the structure according to FIG. 8 are connected by lamination, i.e., the application of heat and/or pressure. Thereby, the previously at least partially uncured resins 142, 146 of the dielectric layers 106, 110 flow into gaps 114, re-solidify and thereby permanently connect the constituents shown in FIG. 9.

Referring to FIG. 10, the structure shown in FIG. 9 is turned upside down.

Referring to FIG. 11, the support layers 126 are peeled off from both opposing main surfaces of the structure shown in FIG. 10.

Referring to FIG. 12, the structure shown in FIG. 11 is subjected to a layer build-up on both opposing main surfaces, for example as described above referring to FIG. 6. If desired, the component carrier 100 according to FIG. 12 may be further processed, for instance by laser drilling, etc.

In the component carrier 100 according to FIG. 12, the electronic component 104 is arranged face down, i.e., with its pads 136 being oriented towards a bottom side.

Figure 13:
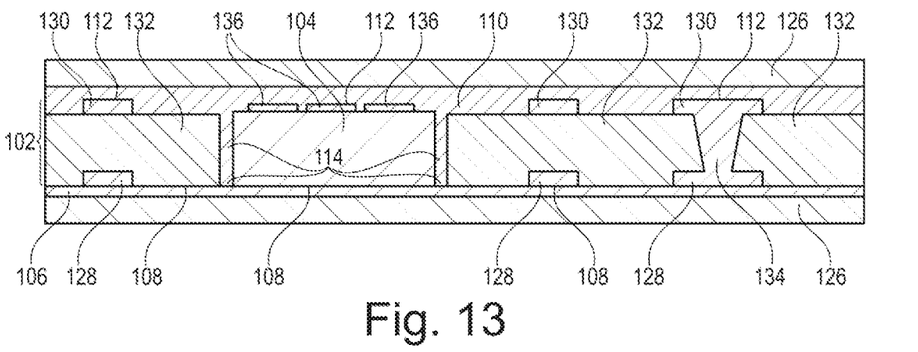
FIG. 13, FIG. 14, and FIG. 15 illustrate cross-sectional views of structures obtained during carrying out a method of manufacturing a component carrier, shown in FIG. 15, according to still other exemplary embodiments of the invention.
Figure 14:
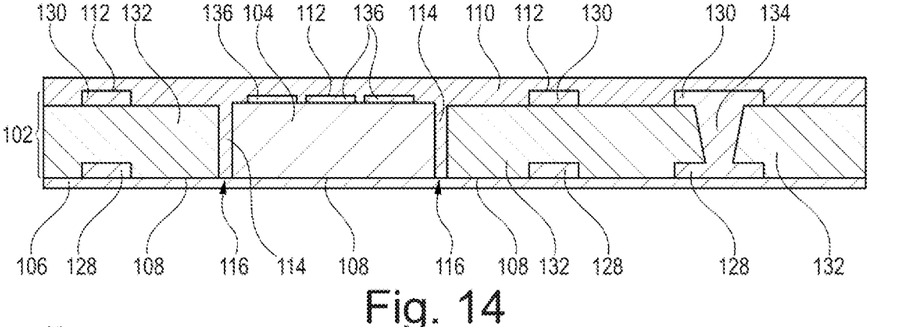
Figure 15:
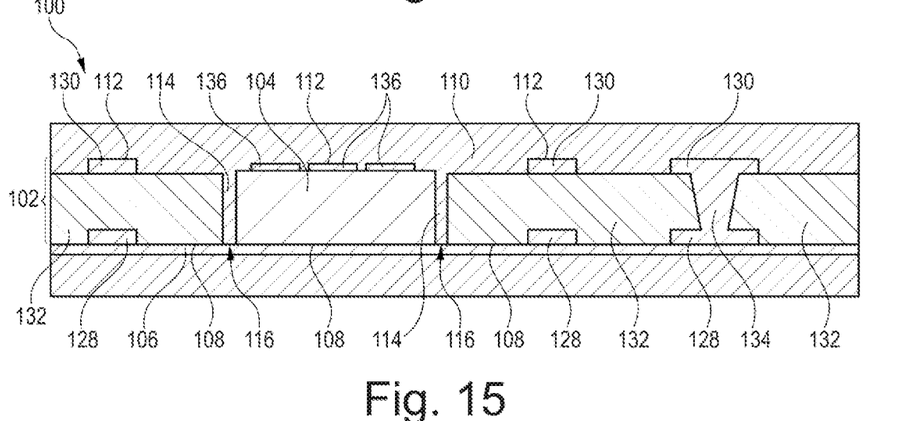

FIG. 13 to FIG. 15 illustrate cross-sectional views of structures obtained during carrying out a method of manufacturing a component carrier 100, shown in FIG. 15, according to still another exemplary embodiment of the invention.

The embodiment of FIG. 13 to FIG. 15 differs from the embodiment according to FIG. 7 to FIG. 12 in particular in that, according to FIG. 13 to FIG. 15, the electronic component 104 is arranged face up in the readily manufactured component carrier 100, i.e., with its pads 136 being oriented towards a top side. This may be a preferred configuration, because a very planar surface may be obtained at the bottom side. Apart from this difference, FIG. 13 corresponds to FIG. 10, FIG. 14 corresponds to FIG. 11, and FIG. 15 corresponds to FIG. 12.

Figure 16:
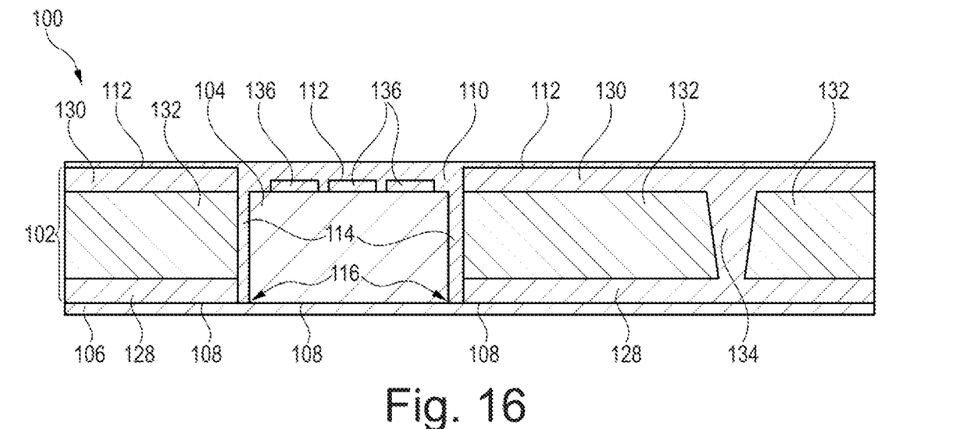
FIG. 16 and FIG. 17 illustrate cross-sectional views of preforms of a component carrier according to another exemplary embodiment of the invention.
Figure 17:
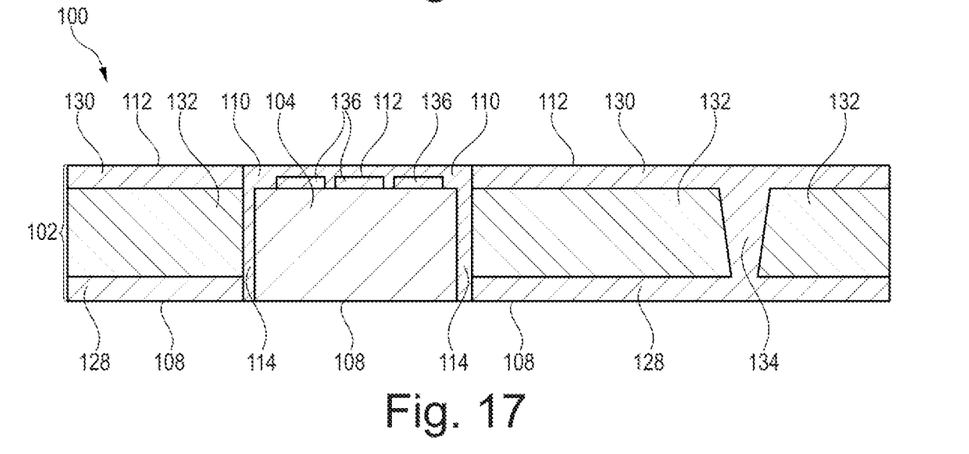

FIG. 16 and FIG. 17 illustrate cross-sectional views of preforms of a component carrier 100 according to another exemplary embodiment of the invention.

FIG. 16 corresponds substantially to FIG. 14 with the difference that, according to FIG. 16, the metal layers 128, 130 on the bottom side and on the top side of the dielectric body 132 of core 102 are continuous layers rather than patterned layers. As a result, and now referring to FIG. 17, excessive material of the second dielectric layer 110 on top of further metal layer 130 may be removed by plasma etching, grinding, etc.

The embodiment of FIG. 16 and FIG. 17 offers the additional opportunity to use an un-patterned core 102 for precisely controlling the dielectric thickness on the top side. Preferably, plasma etch may be used to remove material of the adhesive build-up film from the top side, and thus remove any risk to reliability or the presence of different build-up material in the structure. This may allow to obtain a full flexibility with no trace of the adhesive build-up being utilized.

Figure 18:
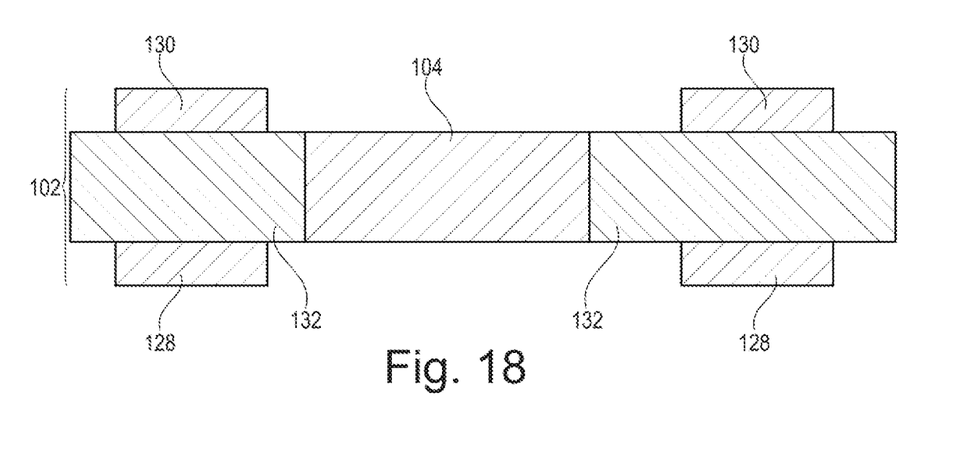
FIG. 18 illustrates a cross-sectional view of a preform of a component carrier according to another exemplary embodiment of the invention.

FIG. 18 illustrates a cross-sectional view of a preform of a component carrier 100 according to an exemplary embodiment of the invention.

FIG. 18 illustrates an advantageous selection of the thickness of the adhesive. It may be advantageous to keep the adhesive dielectric thickness as low as possible. For instance, in case of an embedded trace substrate (ETS)-type core 102, the thickness of the first dielectric layer 106 may be selected as small as 3 μm±2 μm. In case of a patterned core, as shown in FIG. 18, the conditions may be defined advantageously, for instance as follows. The adhesive thickness may be equal to the copper distribution (in the core area only) multiplied with the copper thickness (of preferably less than 7 μm). For example, the copper distribution (in the core area only) may be selected as the ratio of the copper thickness of less than 7 μm divided by 70%, i.e., less than 10 μm.

Figure 20:
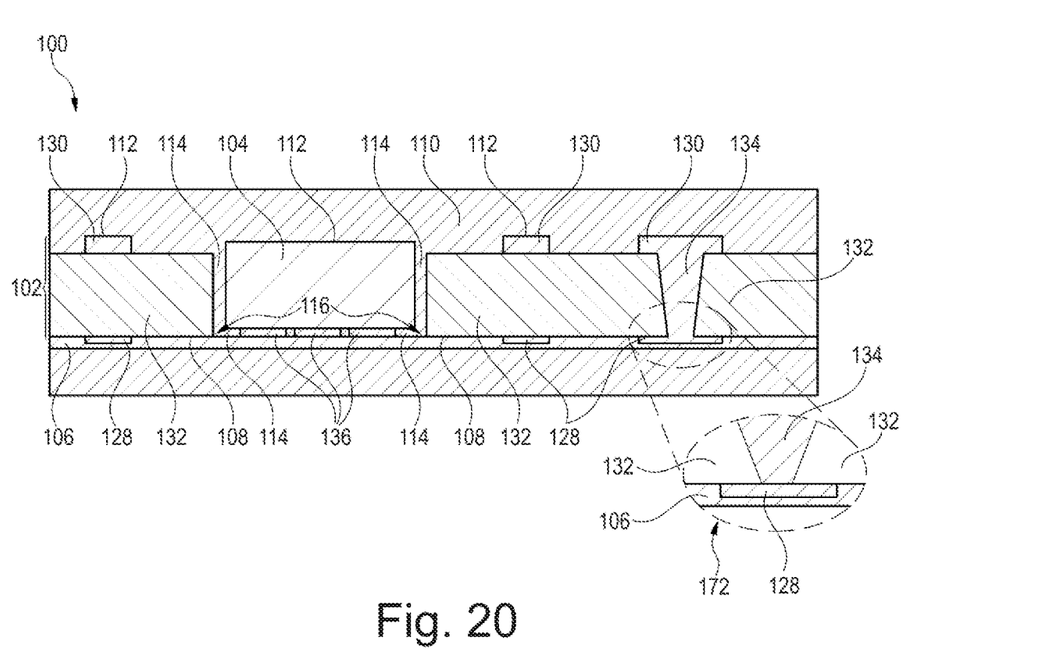

FIG. 19 and FIG. 20 illustrate cross-sectional views of component carriers 100 according to other exemplary embodiments of the invention.

The component carriers 100 according to FIG. 19 and FIG. 20 each comprise a core 102 comprising a dielectric body 132 and a patterned metal layer 128 protruding downwardly beyond a bottom surface of the dielectric body 132. Furthermore, a component 104 is embedded in the core 102. Beyond this, a first dielectric layer 106 is connected at a bottom side 108 of the core 102 and of the component 104 and covers the entire downwardly protruding patterned metal layer 128. Advantageously, a thickness d of the first dielectric layer 106 may be very small, for instance may be 1 μm or may be, more generally, in a range from 0.5 μm to 10 μm. In addition, the component carrier 100 comprises a second dielectric layer 110 being arranged at a top side 112 of the core 102 and of the component 104. The aforementioned constituents of the component carrier 100 can be manufactured and can be embodied as described for the previously described embodiments.

However, according to FIG. 19, the bottom-sided patterned metal layer 128 is partially embedded within the dielectric body 132 and partially protrudes downwardly beyond the dielectric body 132 (see detail 170). The protruding portion of the patterned metal layer 128 is completely inside first dielectric layer 106.

In the embodiment according to FIG. 20, the bottom-sided patterned metal layer 128 is completely arranged below the dielectric body 132, i.e., is formed on a planar bottom main surface of the dielectric body 132 and thus outside of the dielectric body 132 (see detail 172).

Hence, contrary to the embodiments of FIG. 1 to FIG. 15, the embodiments of FIG. 19 and FIG. 20 have patterned metal layers 128 embedded in the first dielectric layer 106 and protruding partially (FIG. 19) or entirely (FIG. 20) vertically beyond the dielectric body 132 in a downward direction. Advantageously, this may result in a mechanical interlocking between the patterned metal layers 128 and the first dielectric layer 106. This suppresses undesired phenomena such delamination and warpage and may improve the mechanical integrity of the component carrier 100 as a whole.

According to all previously described embodiments, the patterned metal layer 128 and/or the further patterned metal layer 130 may protrude less than 18 µm, preferably less than 10 µm, from a respective main surface of the core 102, or even less.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:

1. A component carrier, comprising:
a core comprising a dielectric body;
a component embedded at least partially in the core;
a first dielectric layer being arranged at a bottom side of the core and of the component; and
a second dielectric layer being arranged at a top side of the core and of the component;
wherein a gap around the component in the core is filled adjacent to the bottom side with material of the first dielectric layer and is filled adjacent to the top side with material of the second dielectric layer,
wherein the gap comprises an intermingling region comprising intermingled material of the first dielectric layer and of the second dielectric layer, and
wherein the intermingling region is present between the pure first dielectric layer material and the pure second dielectric layer material.

2. The component carrier according to claim 1, wherein the intermingling region is arranged between a bottom gap region comprising only material of the first dielectric layer and a top gap region comprising only material of the second dielectric layer.

3. The component carrier according to claim 1, wherein a thickness of the first dielectric layer is in a range from 0.5 µm to 10 µm.

4. The component carrier according to claim 1, wherein the first dielectric layer comprises resin and/or is free of fibers.

5. The component carrier according to claim 1, wherein the first dielectric layer comprises filler particles.

6. The component carrier according to claim 1, wherein the second dielectric layer is free of fibers and/or is free of filler particles and/or is a layer of pure resin.

7. The component carrier according to claim 1, wherein the core comprises a patterned metal layer on and/or in a bottom surface of the dielectric body, and wherein the first dielectric layer covers the entire patterned metal layer.

8. The component carrier according to claim 7, comprising at least one of the following features:
wherein the patterned metal layer is partially or entirely embedded within the dielectric body;
wherein the patterned metal layer is entirely arranged below the dielectric body;
wherein the core comprises a further patterned metal layer on and/or in a top surface of the dielectric body, wherein the further patterned metal layer is entirely arranged above the dielectric body.

9. The component carrier according to claim 7, wherein at least one of the patterned metal layer and the further patterned metal layer is protruding less than 18 µm from a surface of the core.

10. The component carrier according to claim 1, wherein a sidewall of the component and/or a sidewall of the dielectric body is covered partially with material of the first dielectric layer and partially with material of the second dielectric layer.

11. A semifinished product for manufacturing a component carrier, comprising:
a core comprising a dielectric body and having a through hole; and
a sticky and at least partially uncured first dielectric layer attached to a bottom side of the core and closing the through hole to thereby define an accommodation volume closed at a bottom side for attaching and embedding a component;
a component embedded at least partially in the closed through hole of the core by attaching the component to the sticky and at least partially uncured first dielectric layer;
a second dielectric layer being arranged at a top side of the core and of the component; and
wherein material of the first dielectric layer and material of the second dielectric layer flow together to form an intermingling region comprising contributions from both dielectric layer materials.

12. The semifinished product according to claim 11, further comprising:
a detachable support layer below the first dielectric layer.

13. The semifinished product according to claim 11, wherein the first dielectric layer comprises or consists of B-stage resin.

14. A component carrier, comprising:
a core comprising a dielectric body and a patterned metal layer protruding downwardly beyond a bottom surface of the dielectric body;
a component embedded at least partially in the core; and
a first dielectric layer being connected at a bottom side of the core and of the component and covering the entire downwardly protruding patterned metal layer;
a second dielectric layer being arranged at a top side of the core and of the component;
wherein a gap around the component in the core is filled adjacent to the bottom side with material of the first dielectric layer and is filled adjacent to the top side with material of the second dielectric layer,
wherein the gap comprises an intermingling region comprising intermingled material of the first dielectric layer and of the second dielectric layer, and
wherein the intermingling region is present between the pure first dielectric layer material and the pure second dielectric layer material.

15. The component carrier according to claim 14, comprising at least one of the following features:

wherein the patterned metal layer is partially embedded within the dielectric body and partially protrudes beyond the dielectric body;

wherein the patterned metal layer is entirely arranged below the dielectric body;

wherein a thickness of the first dielectric layer is in a range from 0.5 μm to 10 μm;

a second dielectric layer being arranged at a top side of the core and of the component.

* * * * *

UNITED STATES PATENT AND TRADEMARK OFFICE
CERTIFICATE OF CORRECTION

PATENT NO. : 12,322,622 B2  
APPLICATION NO. : 17/655480  
DATED : June 3, 2025  
INVENTOR(S) : Artan Baftiri Page 1 of 1

It is certified that error appears in the above-identified patent and that said Letters Patent is hereby corrected as shown below:

On the Title Page

Item (54), and in the Specification, as appears in the left-hand column in the second line, after "COMPONENT" insert -- IN --.

Signed and Sealed this  
Third Day of February, 2026

John A. Squires  
*Director of the United States Patent and Trademark Office*